United States Patent
Dang et al.

(10) Patent No.: US 9,502,082 B1
(45) Date of Patent: Nov. 22, 2016

(54) POWER MANAGEMENT IN DUAL MEMORY PLATFORMS

(71) Applicant: Intel Corporation, Santa Clara, CA (US)

(72) Inventors: Thi Dang, Olympia, WA (US); James S. Burns, Cupertino, CA (US); Russell J. Wunderlich, Livermore, CO (US); Jagannath Coimbatore Premkumar, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/748,728

(22) Filed: Jun. 24, 2015

(51) Int. Cl.
G11C 7/00 (2006.01)
G11C 5/14 (2006.01)
G11C 14/00 (2006.01)
G06F 1/26 (2006.01)
G11C 11/22 (2006.01)

(52) U.S. Cl.
CPC ............ G11C 5/147 (2013.01); G06F 1/26 (2013.01); G11C 14/0018 (2013.01); G11C 11/2297 (2013.01)

(58) Field of Classification Search
CPC . G11C 5/147; G11C 11/2297; G11C 29/021; G11C 5/14; G06F 1/26; G06F 1/263; G06F 1/3203; G06F 1/3275; G06F 1/3287
USPC ............ 365/226, 227, 189.09; 713/320
See application file for complete search history.

(56) References Cited

U.S. PATENT DOCUMENTS

| 4,461,003 A * | 7/1984 | Tamaki | G06F 11/004 340/663 |
| 6,016,017 A * | 1/2000 | Kadanka | H02J 9/061 307/64 |
| 6,327,635 B1 * | 12/2001 | Alston | G06F 13/4081 365/226 |
| 7,710,075 B1 | 5/2010 | Kilbourne et al. | |
| 9,014,637 B1 * | 4/2015 | Skinner | H04W 52/241 455/114.2 |
| 9,195,291 B2 * | 11/2015 | Lee | G06F 9/5094 |
| 2010/0052625 A1 | 3/2010 | Cagno et al. | |
| 2012/0243364 A1 | 9/2012 | Hacking et al. | |
| 2013/0262901 A1 | 10/2013 | Toshiba | |

FOREIGN PATENT DOCUMENTS

WO 2010-080141 A2 7/2010

OTHER PUBLICATIONS

International Search Report and Written Opinion for International Patent Application No. PCT/US2016/032627, mailed Aug. 24, 2016, 17 pages.

\* cited by examiner

*Primary Examiner* — David Lam
(74) *Attorney, Agent, or Firm* — Jordan IP Law, LLC

(57) ABSTRACT

Methods, apparatuses, and systems may provide a sensor to monitor a power consumption of a non-volatile random access memory (RAM) and a volatile RAM. A switch, connected to an output of the sensor, controls power to the non-volatile RAM, and a voltage regulator regulates a voltage of the non-volatile RAM and the volatile RAM. One or more memory slots receive the non-volatile RAM and the volatile RAM, and a processor receives information from the sensor, and controls the voltage regulator based on the received information. The voltage regulator comprises a plurality of registers to store power consumption information of the non-volatile RAM and the volatile RAM.

24 Claims, 4 Drawing Sheets

POWER MANAGEMENT IN DUAL MEMORY PLATFORMS

BACKGROUND

Technical Field

Embodiments generally relate to memory structures. More particularly, embodiments relate to the cost optimized power management of Double Data Rate Fourth Generation (DDR4) memory and Non-Volatile Dual Inline Memory Modules (NVDIMMs) in the same platform in a sleep state.

Discussion

Computing platforms, such as workstations and desktop computers that support an S3 sleep state via an interface defined, for example, in the Advanced Configuration and Power Interface (ACPI, e.g., ACPI Specification, Rev. 5.0a, Dec. 6, 2011) specification, may require different S3 flows for Double Data Rate Fourth Generation (DDR4) memory modules and Non-Volatile Dual Inline Memory Modules (NVDIMMs), due to different S3 power rail requirements. For S3 support, power to the DDR4 memory modules will be switched to standby power, while the power of the NVDIMM memory modules will be turned off. In the related art, multiple switches have to be used to individually control the DDR4 memory modules and the NVDIMM memory modules, thus adding cost.

BRIEF DESCRIPTION OF THE DRAWINGS

The various advantages of the embodiments will become apparent to one skilled in the art by reading the following specification and appended claims, and by referencing the following drawings, in which:

DETAILED DESCRIPTION OF EXEMPLARY EMBODIMENTS

Figure 1:
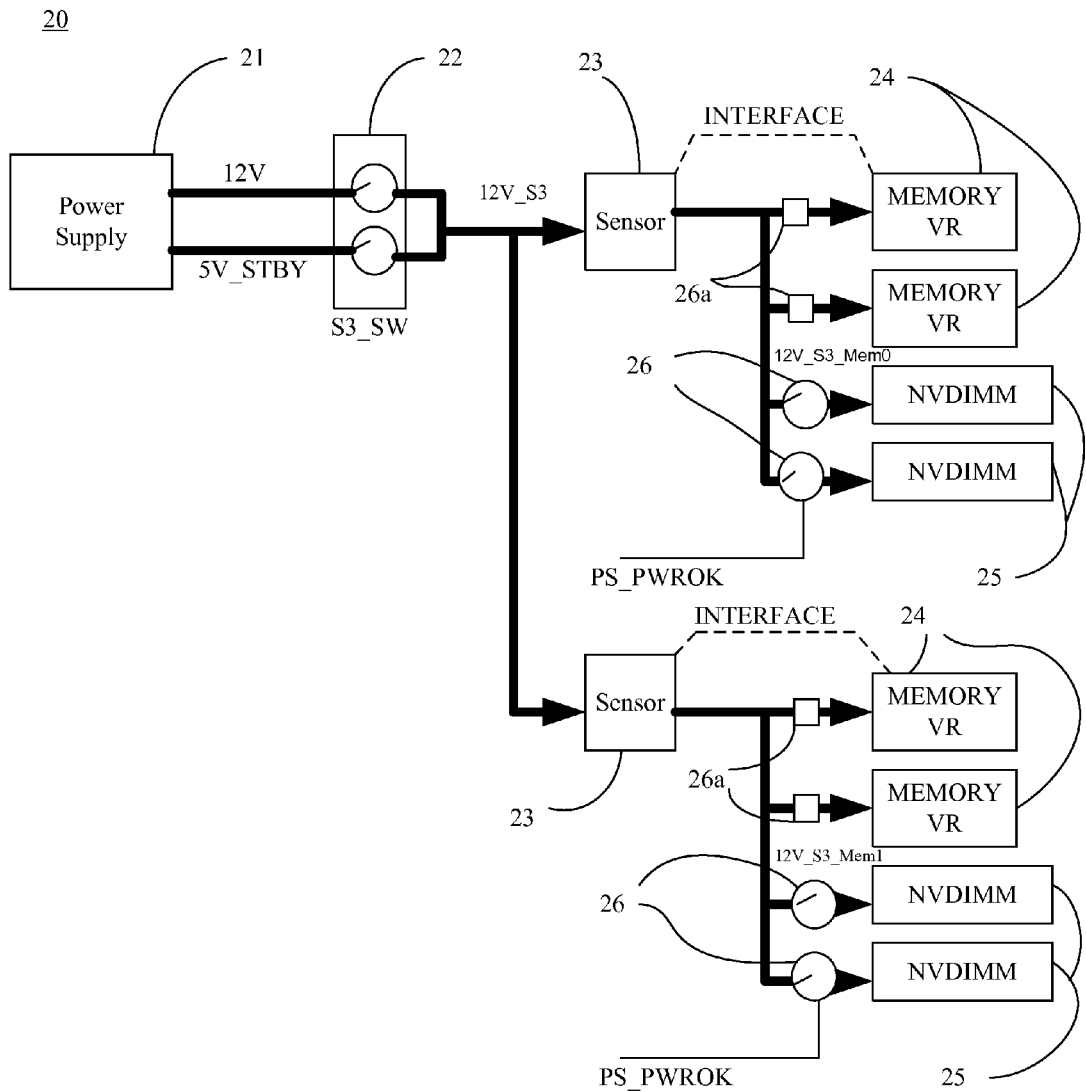
FIG. 1 is an illustration of a related art power management system.

FIG. 1 is a view illustrating a power management system of the related art. The power management system 20 includes a power supply 21, a main switch 22, 12v monitoring sensors 23, memory voltage regulators (VR) 24, non-volatile RAMs 25 and additional switches 26.

In an S3 sleep state, the power to the volatile RAMs may enter a standby state (e.g., "5V_STDBY"). The power to the non-volatile RAMs 25, on the other hand, may be turned off in the S3 sleep state. Thus, when the system is transitioning to the S3 state, the additional switches 26 connected to the non-volatile RAMs 25 may be turned off (e.g., opened).

Since each of the non-volatile RAMs 25 are controlled by the additional switches 26, the cost of the system may increase in the illustrated example.

Figure 2:
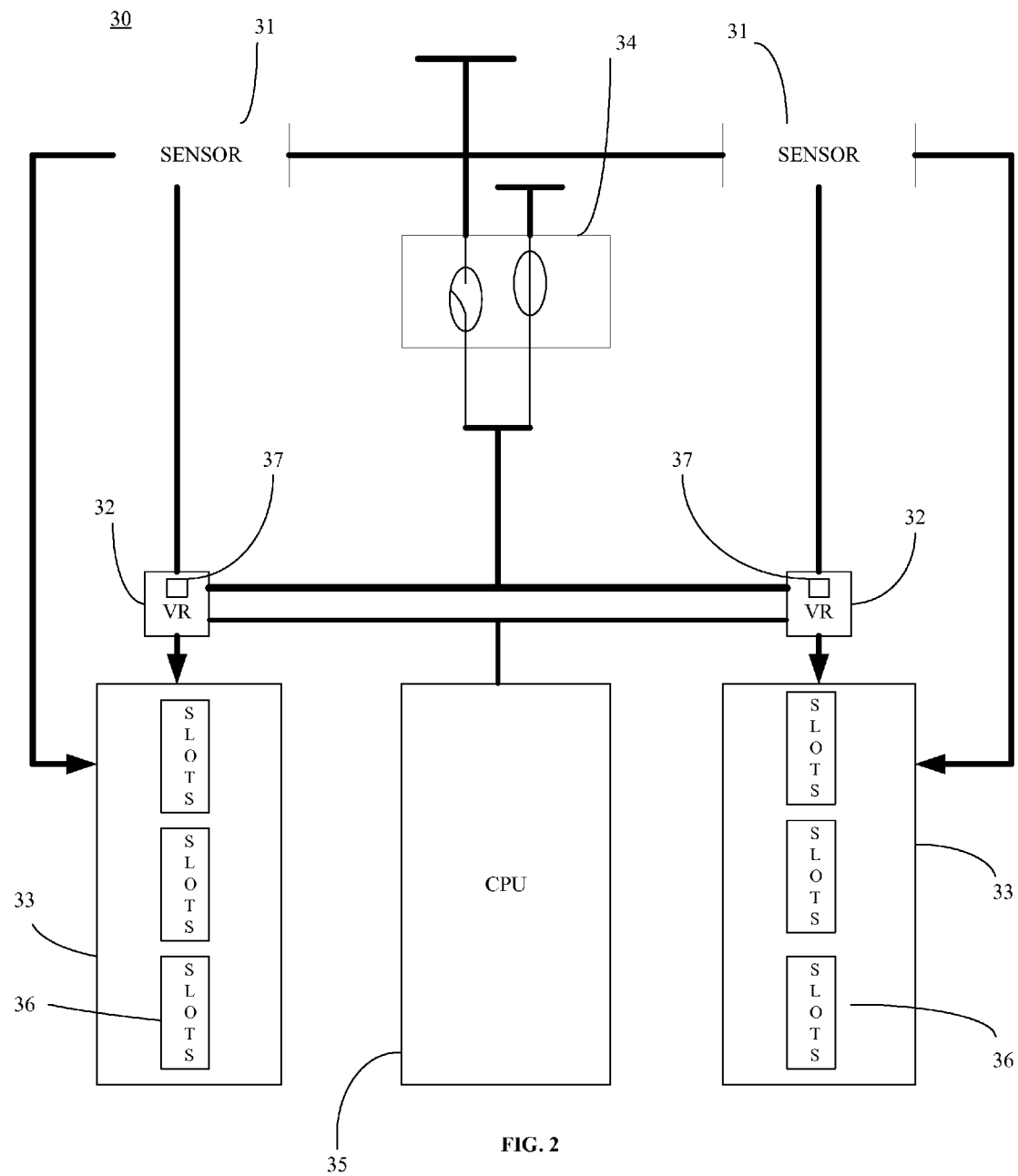
FIG. 2 is an illustration of a power management system according to an embodiment.

FIG. 2 illustrates a power management system 30 having a hybrid memory support apparatus according to an example embodiment. The power management system 30 may include at least one sensor 31 (e.g., 12V), at least one voltage regulator 32, memory modules 33, a single switch 34, and a processor 35.

In one example, the power management system 30 runs on a Running Average Power Limit (RAPL) platform that uses sensors to obtain fine grained energy models. The RAPL allows the processor 35 to monitor power consumption of various components, including non-volatile RAMs. If the power consumption is higher than a predetermined level, the power consumption of the memory modules 33 is throttled down.

The memory modules 33 may include a plurality of slots 36. A plurality of volatile RAMs and non-volatile RAMs may be inserted into each of the slots 36. The non-volatile RAMs may include one or more non-volatile dual inline memory modules (NVDIMMs), and the volatile RAMs may include one or more double data rate (DDR) memory modules. The NVDIMMs may be memory modules that retain content when power is removed by unexpected power loss or after a system crash.

The illustrated voltage regulators 32 automatically control the voltage of the components of the memory modules 33. The voltage regulators 32 may include a plurality of registers 37 to store voltage information and current information of each of the respective volatile RAMs and non-volatile RAMs. The processor 35 may access each of the registers 37 to obtain the voltage and current information of the respective volatile RAMS and non-volatile RAMs, and determines the amount of current that is being consumed by the system.

The voltage registers 32 may be VR13 (voltage regulator series 13) regulators, although any other suitable type of regulator may be used.

The sensor 31 may be an input sensor (e.g., 12V) that senses or measures the power consumption of the non-volatile RAMs and the volatile RAMs. Information from the illustrated sensor 31 is fed to the individual registers 37 of the voltage regulator 32 over a vendor specific interface 36. The processor 35 may then access each of the registers 37 to obtain current and voltage information for each of the non-volatile RAMs and the volatile RAMs.

Specifically, the processor 35 may access specific registers 37 in the voltage regulators 32 to obtain power consumption of each of the NVDIMM memory modules and the DDR memory modules. The processor may sum the power consumption of each memory, and determine if the total consumed power exceeds a predetermined threshold. If the total power consumed by the memories exceeds the predetermined threshold, the processor throttles down the power to the system.

The processor 35 may use precompiled code (p-code) to access the plurality of registers 37 in the voltage regulator to obtain the power consumption information of one or more of the non-volatile RAM, (or NVDIMM), and the volatile RAM, or DDR memory. The power consumption information for the non-volatile RAM, (or NVDIMM), may be stored separately from the power consumption information for the volatile RAM (or DDR memory). For example, a first set of one or more registers 37 may store power consumption of the non-volatile RAM and a second set of one or more registers 37 may store power consumption of the volatile RAM. The p-code in the processor 35 may therefore determine which register 37 in the voltage regulator 32 should be accessed to obtain the power consumption information, and access each individual register to obtain power consumption information.

Instead of having multiple switches individually control each of the non-volatile RAMs as discussed above with regard to the related art, the exemplary embodiment uses the single switch 34 to regulate the voltage of the non-volatile RAMs. The single 34 may be an S3 power switch, wherein when the system transitions to an S3 state, the power supply may be shut off. Accordingly, no power is supplied to the non-volatile RAM, in the illustrated example.

As illustrated in FIG. 2, the sensors 31 are connected in front of the switch 34. Specifically, an output of the sensors 31 is connected to an input of the switch 34. Accordingly, when the sleep state is switched to an S3 state, standby power is transmitted to the voltage regulators 32, and the main power is shut off. Accordingly, in addition to the main power to the volatile RAMs being shut off, the main power to the non-volatile RAMs is also shut off.

Figure 3:
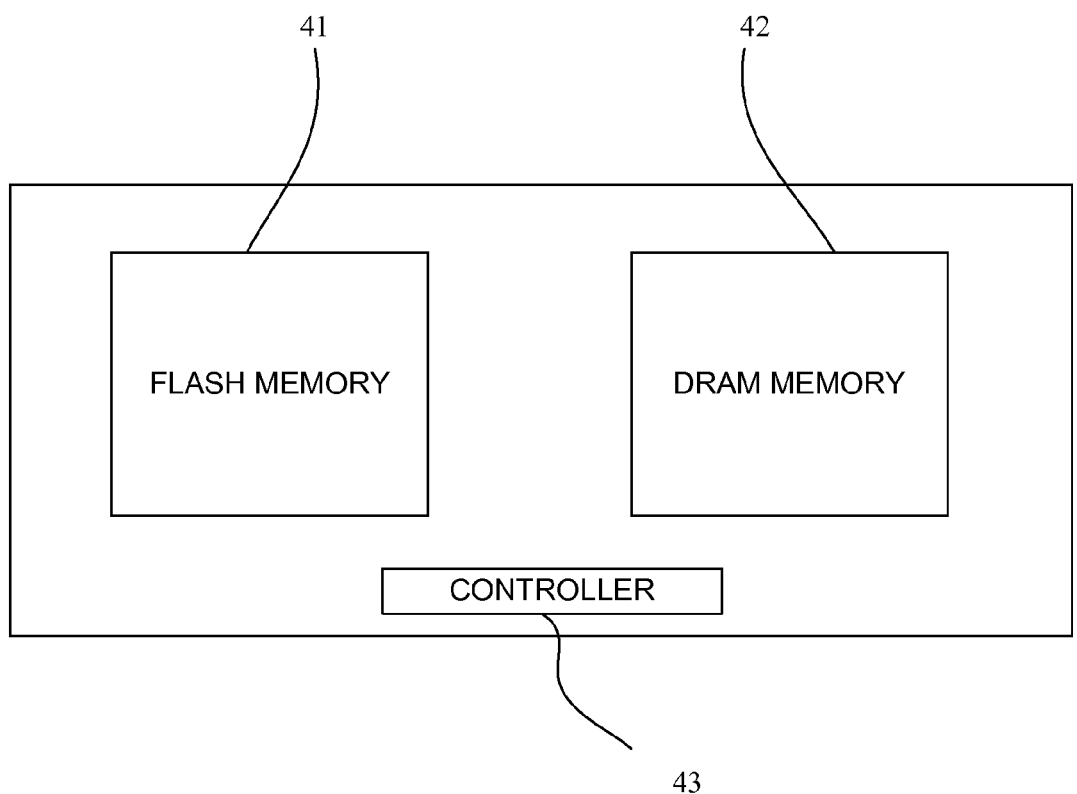
FIG. 3 is an illustration of a NVDIMM according to an embodiment.

FIG. 3 illustrates a NVDIMM 40 according to an embodiment. The NVDIMM 40 may include a flash memory 41, a DRAM 42 and a controller 43. The NVDIMM 40 may include a capacitor or battery (not shown) to store energy. When power is lost, data stored in the DRAM 42 may be copied to the flash memory 41. When power is restored, the data stored in the flash memory 41 may be transferred to the DRAM 42.

Figure 4:
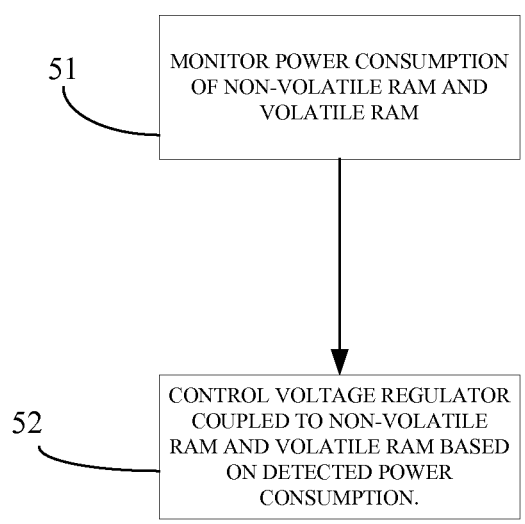
FIG. 4 shows a flowchart of an example of a method of operating a processor according to an embodiment.

FIG. 4 shows a method of operating a processor according to an example embodiment. The method 50 may be implemented as one or more modules in a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof. For example, computer program code to carry out operations shown in method 50 may be written in any combination of one or more programming languages, including an object oriented programming language such as C, JAVA or the like.

In the illustrated processing block 51, the power consumption of one or more non-volatile RAMs and one or more volatile RAMs is monitored. On the basis of the detected power consumption, in processing block 52 a voltage regulator, for example, voltage regulator 32 illustrated in FIG. 2, coupled to the one or more non-volatile RAMs and volatile RAMs, is controlled. The processor 35 may use precompiled code (p-code) to communicate with a memory controller (not shown) in the processor 35 illustrated in FIG. 2, to throttle the memory modules 33 illustrated in FIG. 2 in order to reduce the power of the memory modules 33 to a value below a threshold value of the RAPL.

ADDITIONAL NOTES AND EXAMPLES

Example 1 may include a power management system comprising a sensor to monitor a power consumption of a non-volatile random access memory (RAM) and a volatile RAM, a switch, connected to an output of the sensor, to control power to the non-volatile RAM, a voltage regulator to regulate a voltage of the non-volatile RAM and the volatile RAM, memory slots to receive the non-volatile RAM and the volatile RAM; and a processor to receive information from the sensor, and control the voltage regulator based on the received sensor information.

Example 2 may include the system of claim 1, further comprising a vendor specific interface between the sensor and the voltage regulator to transfer information between the sensor and the voltage regulator.

Example 3 may include the system of claim 1, wherein the voltage regulator comprises a plurality of registers to store power consumption information of the non-volatile RAM and the volatile RAM.

Example 4 may include the system of claim 1, wherein the plurality of registers includes: a first set of one or more registers to store power consumption of the non-volatile RAM; and a second set of one or more registers to store power consumption of the volatile RAM.

Example 5 may include the system of claim 4, wherein the processor includes precompiled code (p-code) to access the plurality of registers in the voltage regulator to obtain the power consumption information of one or more of the non-volatile RAM and the volatile RAM.

Example 6 may include the system of any one of claims 1 to 5, wherein the non-volatile RAM includes one or more non-volatile dual inline memory modules (NVDIMMs), and the volatile RAM includes one or more double data rate (DDR) memory modules.

Example 7 may include an apparatus comprising a sensor to monitor a power consumption of a non-volatile random access memory (RAM) and a volatile RAM; a switch, connected to an output of the sensor, to control power to the non-volatile RAM; and a voltage regulator to regulate a voltage of the non-volatile RAM and the volatile RAM based on the power consumption.

Example 8 may include the apparatus of claim 7, wherein the voltage regulator comprises a plurality of registers to store power consumption information of the non-volatile RAM and the volatile RAM.

Example 9 may include the apparatus of claim 7, wherein the voltage regulator comprises a plurality of registers to store power consumption information of the non-volatile RAM and the volatile RAM.

Example 10 may include the apparatus of claim 9, wherein the plurality of registers include a first set of one or more registers to store power consumption of the non-volatile RAM; and a second set of one or more registers to store power consumption of the volatile RAM.

Example 11 may include the apparatus of claim 7, wherein the non-volatile RAM includes one or more non-volatile dual inline memory modules (NVDIMMs).

Example 12 may include the method of claim 7, wherein the volatile RAM includes one or more double data rate (DDR) memory modules.

Example 13 may include a method comprising monitoring a power consumption of a non-volatile random access memory (RAM) and a volatile RAM; and controlling a voltage regulator coupled to the non-volatile RAM and the volatile RAM based on the power consumption.

Example 14 may include the method of claim 13, further comprising transferring information over a vendor specific interface between a sensor and a voltage regulator.

Example 15 may include the method of claim 13, further comprising storing power consumption information of the non-volatile RAM and the volatile RAM in a plurality of registers of a voltage regulator.

Example 16 may include the method of claim 15, further comprising storing power consumption information of the non-volatile RAM in a first set of one or more registers of the voltage regulator; and storing power consumption information of the volatile RAM in a second set of one or more registers of the voltage regulator.

Example 17 may include the method of claim 15, further comprising using precompiled code (p-code) to access the power consumption information of one or more of the non-volatile RAM and the volatile RAM in the plurality of registers.

Example 18 may include the method of claim 13, further comprising summing the power consumption of one or more of the non-volatile RA and the volatile RAM; determining if the total consumed power exceeds a predetermined threshold; and throttling down the power if the total consumed power exceeds the predetermined threshold.

Example 19 may include the method of claim 13, wherein the non-volatile RAM includes one or more non-volatile dual inline memory modules (NVDIMMs), and the volatile RAM includes one or more double data rate (DDR) memory modules.

Example 20 may include at least one non-transitory computer readable storage medium, comprising a set of instructions which, when executed by a computing device causes the computing device to monitor a power consumption of a non-volatile random access memory (RAM) and a volatile RAM; and control power to the non-volatile RAM by regulating a voltage of the non-volatile RAM and the volatile RAM based on the power consumption.

Example 21 may include the at least one computer readable storage medium of claim 20, wherein the instructions, when executed, cause the computing device to transfer information over a vendor specific interface between a sensor and a voltage regulator.

Example 22 may include the at least one computer readable storage medium of claim 20, wherein the instructions, when executed, cause the computing device to store power consumption information of the non-volatile RAM and the volatile RAM in a plurality of registers of a voltage regulator.

Example 23 may include the at least one computer readable storage medium of claim 22, wherein the instructions, when executed, cause the computing device to store power consumption information of the non-volatile RAM in a first set of one or more registers of the voltage regulator; and store power consumption information of the volatile RAM in a second set of one or more registers of the voltage regulator.

Example 24 may include the at least one computer readable storage medium of claim 20, wherein the instructions, when executed, cause the computing device to use precompiled code (p-code) to access the power consumption information of one or more of the non-volatile RAM and the volatile RAM in the plurality of registers.

Techniques described herein may therefore provide a methodology for obtaining cost-optimized RAPL implementation with NVDIMMs. The methodology may be used in Crystal Ridge, NVDIMM, and Purley platforms. There are two key elements for S3 support that are considered (1) S3 support for DDR4/DDR4L would require board logic to switch between the main power rail (e.g., 12V) and standby power, and (2) NVDIMM requires that no power is supplied to the NVDIMM during the S3 power state.

The same S3 and RAPL flows are allowed for both DDR4s and NVDIMMs in the same system without adding additional board logic for power switching between the main power rail and standby power.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments can be implemented in a variety of forms. Therefore, while the embodiments of this have been described in connection with particular examples thereof, the true scope of the embodiments should not be so limited since other modifications will become apparent to the skilled practitioner upon a study of the drawings, specification, and following claims.

We claim:

1. A system comprising:
   a sensor to monitor a power consumption of a non-volatile random access memory (RAM) and a volatile RAM;
   a switch, connected to an output of the sensor, to control power to the non-volatile RAM;
   a voltage regulator to regulate a voltage of the non-volatile RAM and the volatile RAM;
   one or more memory slots to receive the non-volatile RAM and the volatile RAM; and
   a processor to receive information from the sensor and control the voltage regulator based on the received information.

2. The system of claim 1, further comprising a vendor specific interface between the sensor and the voltage regulator to transfer information between the sensor and the voltage regulator.

3. The system of claim 1, wherein the voltage regulator comprises a plurality of registers to store power consumption information of the non-volatile RAM and the volatile RAM.

4. The system of claim 3, wherein the plurality of registers includes:
   a first set of one or more registers to store power consumption of the non-volatile RAM; and
   a second set of one or more registers to store power consumption of the volatile RAM.

5. The system of claim 4, wherein the processor includes precompiled code (p-code) to access the plurality of registers in the voltage regulator to obtain the power consumption information of one or more of the non-volatile RAM and the volatile RAM.

6. The system of claim 1, wherein the non-volatile RAM includes one or more non-volatile dual inline memory modules (NVDIMMs), and the volatile RAM includes one or more double data rate (DDR) memory modules.

7. An apparatus comprising:
   a sensor to monitor a power consumption of a non-volatile random access memory (RAM) and a volatile RAM;
   a switch, connected to an output of the sensor, to control power to the non-volatile RAM; and
   a voltage regulator to regulate a voltage of the non-volatile RAM and the volatile RAM based on the power consumption.

8. The apparatus of claim 7, further comprising a vendor specific interface between the sensor and the voltage regulator to transfer information between the sensor and the voltage regulator.

9. The apparatus of claim 7, wherein the voltage regulator comprises a plurality of registers to store power consumption information of the non-volatile RAM and the volatile RAM.

10. The apparatus of claim 9, wherein the plurality of registers include:
a first set of one or more registers to store power consumption of the non-volatile RAM; and
a second set of one or more registers to store power consumption of the volatile RAM.

11. The apparatus of claim 7, wherein the non-volatile RAM includes one or more non-volatile dual inline memory modules (NVDIMMs).

12. The method of claim 7, wherein the volatile RAM includes one or more double data rate (DDR) memory modules.

13. A method comprising:
monitoring a power consumption of a non-volatile random access memory (RAM) and a volatile RAM; and
controlling a voltage regulator coupled to the non-volatile RAM and the volatile RAM based on the power consumption.

14. The method of claim 13, further comprising transferring information over a vendor specific interface between a sensor and a voltage regulator.

15. The method of claim 13, further comprising storing power consumption information of the non-volatile RAM and the volatile RAM in a plurality of registers of a voltage regulator.

16. The method of claim 15, further comprising:
storing power consumption information of the non-volatile RAM in a first set of one or more registers of the voltage regulator; and
storing power consumption information of the volatile RAM in a second set of one or more registers of the voltage regulator.

17. The method of claim 15, further comprising using precompiled code (p-code) to access the power consumption information of one or more of the non-volatile RAM and the volatile RAM in the plurality of registers.

18. The method of claim 13, further comprising:
summing the power consumption of one or more of the non-volatile RAM and the volatile RAM;
determining if the total consumed power exceeds a predetermined threshold; and
throttling down the power if the total consumed power exceeds the predetermined threshold.

19. The method of claim 13, wherein the non-volatile RAM includes one or more non-volatile dual inline memory modules (NVDIMMs), and the volatile RAM includes one or more double data rate (DDR) memory modules.

20. At least one non-transitory computer readable storage medium, comprising a set of instructions which, when executed by a computing device causes the computing device to:
monitor a power consumption of a non-volatile random access memory (RAM) and a volatile RAM; and
control power to the non-volatile RAM by regulating a voltage of the non-volatile RAM and the volatile RAM based on the power consumption.

21. The at least one computer readable storage medium of claim 20, wherein the instructions, when executed, cause the computing device to transfer information over a vendor specific interface between a sensor and a voltage regulator.

22. The at least one computer readable storage medium of claim 20, wherein the instructions, when executed, cause the computing device to store power consumption information of the non-volatile RAM and the volatile RAM in a plurality of registers of a voltage regulator.

23. The at least one computer readable storage medium of claim 22, wherein the instructions, when executed, cause the computing device to:
store power consumption information of the non-volatile RAM in a first set of one or more registers of the voltage regulator; and
store power consumption information of the volatile RAM in a second set of one or more registers of the voltage regulator.

24. The at least one computer readable storage medium of claim 20, wherein the instructions, when executed, cause the computing device to use precompiled code (p-code) to access the power consumption information of one or more of the non-volatile RAM and the volatile RAM in the plurality of registers.

* * * * *